United States Patent
Xu

(10) Patent No.: US 12,538,742 B2
(45) Date of Patent: Jan. 27, 2026

(54) WAFER POSITION DETECTION DEVICE

(71) Applicant: HANGZHOU SIZONE ELECTRONIC TECHNOLOGY INC., Zhejiang (CN)

(72) Inventor: Xiaoyu Xu, Zhejiang (CN)

(73) Assignee: HANGZHOU SIZONE ELECTRONIC TECHNOLOGY INC., Zhejiang (CN)

( * ) Notice: Subject to any disclaimer, the term of this patent is extended or adjusted under 35 U.S.C. 154(b) by 328 days.

(21) Appl. No.: 18/280,677

(22) PCT Filed: Oct. 20, 2021

(86) PCT No.: PCT/CN2021/118651
§ 371 (c)(1),
(2) Date: Sep. 7, 2023

(87) PCT Pub. No.: WO2022/188385
PCT Pub. Date: Sep. 15, 2022

(65) Prior Publication Data
US 2024/0145279 A1 May 2, 2024

(30) Foreign Application Priority Data
Mar. 8, 2021 (CN) .......................... 202110249025.5

(51) Int. Cl.
*H01L 21/67* (2006.01)
*G01B 21/00* (2006.01)

(52) U.S. Cl.
CPC ........ *H01L 21/67265* (2013.01); *G01B 21/00* (2013.01); *H01L 21/67253* (2013.01)

(58) Field of Classification Search
CPC .................... H01L 21/67265; H01L 21/67253
See application file for complete search history.

(56) References Cited

U.S. PATENT DOCUMENTS

| 2004/0073328 A1 | 4/2004 | De Haas et al. |
| 2016/0172256 A1* | 6/2016 | Rose .................. H01L 22/26 |
| | | 438/10 |

(Continued)

FOREIGN PATENT DOCUMENTS

| CN | 102299091 | | 12/2011 | |
| CN | 102653883 A | * | 9/2012 | ............. C23C 16/46 |

(Continued)

OTHER PUBLICATIONS

"International Search Report (Form PCT/ISA/210) of PCT/CN2021/118651," mailed on Nov. 25, 2021, with English translation thereof, pp. 1-4.

(Continued)

*Primary Examiner* — Stephanie E Bloss
*Assistant Examiner* — Diana Hancock
(74) *Attorney, Agent, or Firm* — JCIPRNET

(57) ABSTRACT

The invention discloses a wafer position detection device comprising a mounting base, a trigger component and a fluid pressure detection component; the trigger component arranged on the mounting base comprises a top cover protruding from a surface of the mounting base, and a fluid delivery pipeline formed in an inner wall of the top cover; when a wafer is arranged on the top cover, the top cover moves in the direction close to the fluid delivery pipeline to block a fluid delivery port of the fluid delivery pipeline; when no wafer is arranged on the top cover, the top cover moves in the direction away from the fluid delivery pipeline under fluid pressure to open the fluid delivery port of the fluid delivery pipeline; the fluid pressure detection component makes indirect contact with the wafer through the top cover to indirectly detect the position of the wafer.

8 Claims, 5 Drawing Sheets

(56) References Cited

U.S. PATENT DOCUMENTS

| | | | | |
|---|---|---|---|---|
| 2019/0164790 A1* | 5/2019 | Liu | ................... | H01L 21/67386 |
| 2020/0083087 A1* | 3/2020 | Ni | ..................... | H01J 37/32816 |

FOREIGN PATENT DOCUMENTS

| | | |
|---|---|---|
| CN | 208806227 | 4/2019 |
| CN | 209496845 | 10/2019 |
| CN | 110896045 | 3/2020 |
| CN | 112614797 | 4/2021 |
| JP | 2011243834 | 12/2011 |
| JP | 2017061055 | 3/2017 |
| JP | 2018093018 | 6/2018 |
| JP | 2020170800 | 10/2020 |
| KR | 20120134368 | 12/2012 |
| KR | 20200070787 | 6/2020 |

OTHER PUBLICATIONS

"Office Action of Korea Counterpart Application", issued on Nov. 28, 2024, p. 1-p. 8.
"Search Report of Europe Counterpart Application", issued on Feb. 24, 2025, p. 1-p. 6.
"Office Action of Japan Counterpart Application", issued on Aug. 30, 2024, p. 1-p. 2.

* cited by examiner

WAFER POSITION DETECTION DEVICE

CROSS-REFERENCE TO RELATED APPLICATION

This application is a 371 of international application of PCT application serial no. PCT/CN2021/118651, filed on Oct. 20, 2021, which claims the priority benefit of China application no. 202110249025.5, filed on Mar. 8, 2021. The entirety of each of the above mentioned patent applications is hereby incorporated by reference herein and made a part of this specification.

TECHNICAL FIELD

The invention relates to the field of semiconductor processing equipment, in particular to a wafer position detection device.

BACKGROUND

In recent years, with the rapid development of the semiconductor industry, the critical dimension of semiconductor chips has been reduced from 0.18 lam to less than 10 nm, and the number of metal layers has evolved from 5-6 to more. The adoption of copper multilayer wiring has effectively addressed the limitations of aluminum interconnection technology, while also imposing higher standards for global planarization. As the most advanced technique for achieving global planarization, chemical mechanical polishing (CMP) plays a crucial role in the copper interconnection process. Nonetheless, in the copper (Cu) CMP process, it is worth noting that corrosion defects are likely to happen in addition to commonly encountered issues such as butterfly patterns, erosion, and scratching.

Each part of CMP planarization equipment requires real-time wafer position monitoring. For example, during the polishing process, wafer is first placed on a carrier table by robot arm. Once the wafer is detected to be positioned correctly on a designated workstation, the wafer is picked up from the carrier table using a polishing head for polishing. After the wafer polishing is completed, the wafer is returned back to the carrier table using the polishing head and transferred to a cleaning unit using the robot arm. In this process, if there is any occurrence of vibrations or shaking of the carrier table during movement or wafer transfer by the robot arm, the wafer will be improperly positioned on the carrier table, which, in turn, may result in failure in wafer handling or even wafer breakage.

The existing technical solutions for wafer detection generally use lever braking type sensors distributed around the wafer for indirect detection. When the wafer deviates from its intended position, the signals from the sensors exhibit differences, which serve as the basis for judgment. However, the lever braking type sensors used for indirect detection tend to generate particles due to component friction and have a complex structure. Moreover, a braking lever can easily scratch the surface of the wafer, leading to difficulties in installation and maintenance, and affecting the accuracy of indirect detection. Alternatively, there are technical solutions that use sensors distributed around the wafer for direct detection, such as optical sensors. However, this type of direct detection is not suitable for processes that are sensitive to light, such as the copper process. Moreover, the presence of polishing fluids and splashing droplets in the work environment can result in the generation of false alarms by optical sensors.

SUMMARY

In view of this, the objective of the invention is to provide a wafer position detection device to address the issue of surface defects on wafers caused by indirect detection sensors, which adversely affect yield rates, and the limitations associated with the application scope of direct detection sensors.

In order to achieve the above objective, the invention provides the following technical solution.

A wafer position detection device comprises:
a mounting base;
a trigger component arranged on the mounting base, wherein the trigger component comprises a top cover protruding from a surface of the mounting base to support a wafer, and a fluid delivery pipeline arranged in a hollow cavity formed in an inner wall of the top cover; when a wafer is arranged on the top cover, the top cover moves in the direction close to the fluid delivery pipeline to block a fluid delivery port of the fluid delivery pipeline; and when no wafer is arranged on the top cover, the top cover moves in the direction away from the fluid delivery pipeline under fluid pressure to open the fluid delivery port of the fluid delivery pipeline; and
a fluid pressure detection component connected with a control device and used for detecting the fluid pressure of the fluid delivery pipeline.

Preferably, the mounting base is provided with a mounting groove for mounting the top cover, and a surface of the mounting groove is provided with a gland for limiting the movement of the top cover in the direction away from the fluid delivery pipeline.

Preferably, a circumferential side wall of the mounting groove is provided with a strip-shaped guide slot for linearly guiding the movement of the top cover, and the strip-shaped guide slot is parallel to a center line of the mounting groove; and the top cover is provided with a guide protrusion matching the strip-shaped guide slot.

Preferably, the wafer position detection device further comprises an output hole formed in the mounting base and used for discharging fluid in the hollow cavity, and the output hole is formed in a bottom wall of the mounting groove and penetrates through the mounting base in a direction away from the top cover.

Preferably, the fluid delivery pipeline comprises:
a nozzle detachably and fixedly connected to the mounting base; and
an input pipeline with one end connected with the nozzle and the other end connected with a fluid power source.

Preferably, the mounting base is provided with a mounting through hole for mounting the nozzle, the mounting through hole penetrates through the mounting base in a thickness direction of the mounting base and is provided with an internal thread, and the nozzle is provided with an external thread matching the internal thread.

Preferably, the control device comprises:
a fluid pressure determining unit used for determining whether a fluid pressure value detected by the fluid pressure detection component is equal to a first preset pressure value, and if so, sending a prompting message indicating that the wafer is properly positioned currently; determining whether the fluid pressure value detected by the fluid pressure detection component is equal to a second preset pressure value, and if so, sending a prompting message indicating that there is no wafer at a current station, the first preset pressure value being greater than the second preset pressure value; and determining whether the fluid pressure value detected by the fluid pressure detection component is greater than the second preset pressure value and less than the first preset pressure value, and if so, sending a prompting message indicating that the wafer is not properly positioned currently.

Preferably, the top cover is a cambered top cover.

Preferably, the wafer position detection device comprises a plurality of trigger components, which are uniformly arranged on the mounting base.

Preferably, the wafer position detection device comprises three trigger components which are symmetrical with respect to a center of the mounting base, and the fluid delivery pipelines of the three trigger components are each connected with one fluid pressure detection component.

The wafer position detection device provided by the invention comprises a mounting base; a trigger component arranged on the mounting base, wherein the trigger component comprises a top cover protruding from a surface of the mounting base to support a wafer, and a fluid delivery pipeline arranged in a hollow cavity formed in an inner wall of the top cover; when a wafer is arranged on the top cover, the top cover moves in the direction close to the fluid delivery pipeline to block a fluid delivery port of the fluid delivery pipeline; and when no wafer is arranged on the top cover, the top cover moves in the direction away from the fluid delivery pipeline under fluid pressure to open the fluid delivery port of the fluid delivery pipeline; and a fluid pressure detection component connected with a control device and used for detecting the fluid pressure of the fluid delivery pipeline.

Compared with the prior art, the wafer position detection device provided by the invention has the following technical effects:

first, the fluid pressure detection component makes indirect contact with the wafer through the top cover to indirectly detect the position of the wafer; compared with lever braking type sensors, the fluid pressure detection component does not need to make direct contact with the wafer, preventing surface defects that will affect yield rates caused by direct contact; and compared with optical sensors, the wafer position detection device realizes position detection of light-sensitive wafers, broadening the application range and improving device versatility;

second, whether the wafer is properly positioned is determined by comparing the pressure value detected by the fluid pressure detection component and the preset pressure value, and guidance is provided for subsequent wafer position adjustment according to the pressure values detected by the fluid pressure detection component at different positions;

third, the top of the top cover is a cambered surface, which is in point contact with a wafer plane, thus reducing the contact area between the two and preventing accumulation of impurities between the top cover and the wafer; and when impurities exist between the top cover and the wafer, as the scratch area caused by relative sliding is reduced, the yield rate is improved; and fourth, the strip-shaped guide slot is formed in the mounting groove, so that the top cover can only move in a linear direction, and the rotation freedom that may occur under the action of fluid is limited to prevent scratches from being generated between the top cover and the wafer due to the rotation of the top cover, thus maintaining relative stability between the top cover and the wafer and further improving the reliability of the device.

DESCRIPTION OF DRAWINGS

In order to more clearly explain the embodiments of the invention or the technical scheme in the prior art, the following will briefly introduce the drawings needed in the description of the embodiments or the prior art. Obviously, the drawings in the following description are only for some embodiments of the invention. For those of ordinary skill in the art, other drawings can be obtained according to the provided drawings without creative labor.

Figure 1:
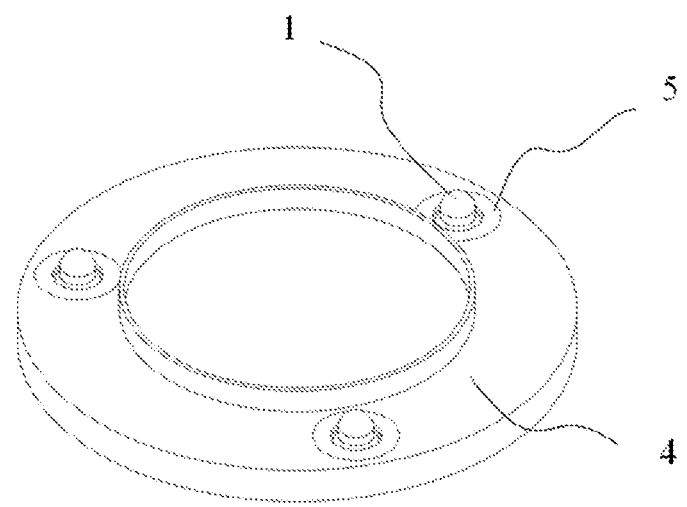
FIG. 1 is a diagram of an external structure of a wafer position detection device provided by an embodiment of the invention.

DESCRIPTION OF REFERENCE NUMERALS 1, top cover; 2, nozzle; 3, water pressure sensor; 4, mounting base; 5, gland; 6, wafer.

DETAILED DESCRIPTION

An embodiment of the invention discloses a wafer position detection device, which aims to address the issue of surface defects on wafers caused by direct contact by sensors, which adversely affect yield rates.

The technical schemes in the embodiments of the invention are clearly and completely described in the following with reference to the drawings in the embodiments of the invention. It is obvious that the described embodiments are only illustrative ones, and are not all possible ones of the invention. Based on the embodiments of the invention, all other embodiments obtained by those of ordinary skill in the art without creative labor are within the scope of the invention.

Figure 2:
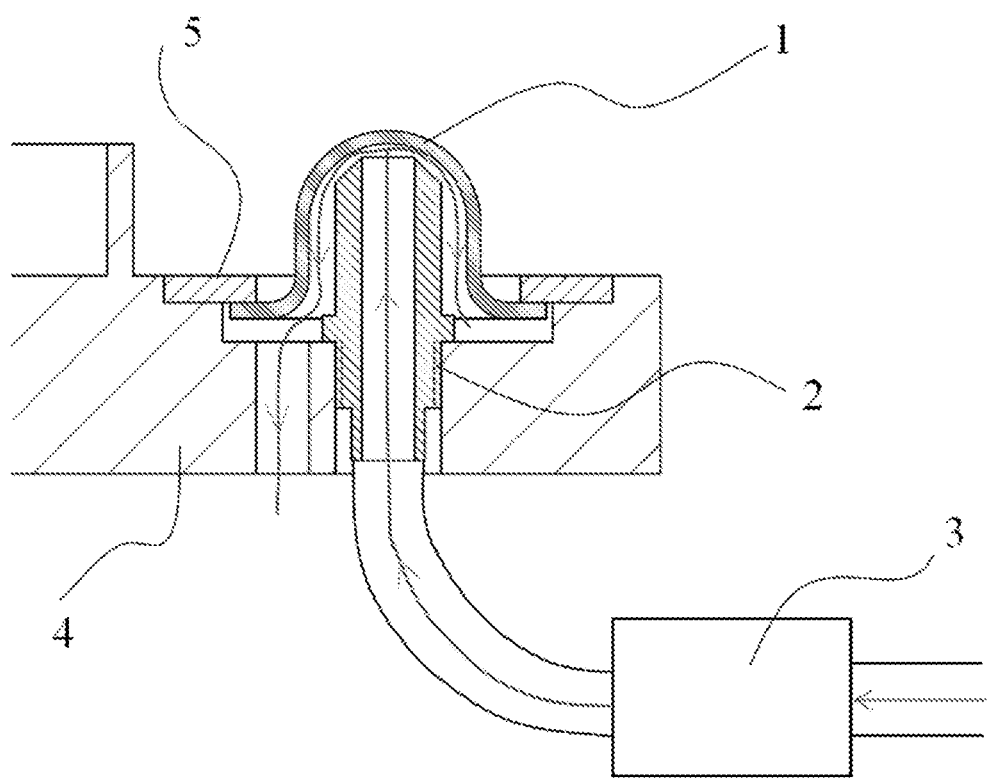
FIG. 2 is a partial sectional view of FIG. 1.
Figure 3:
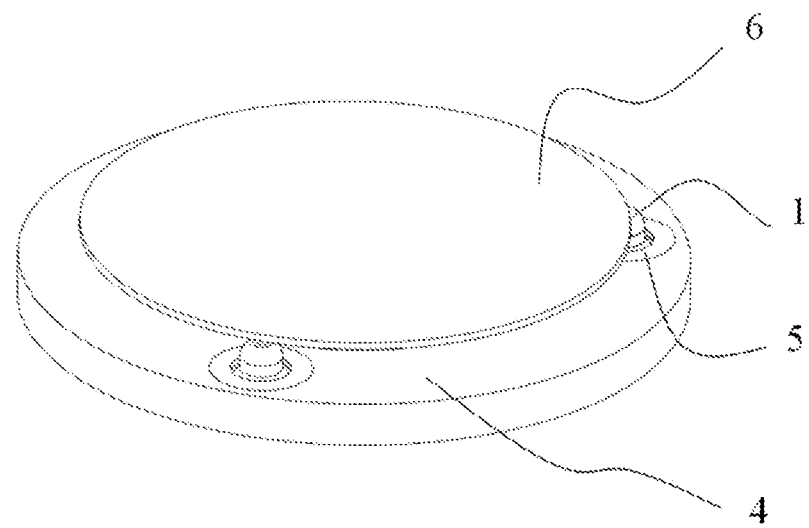
FIG. 3 is a diagram of an installation structure of a wafer and a wafer position detection device provided by an embodiment of the invention.
Figure 4:
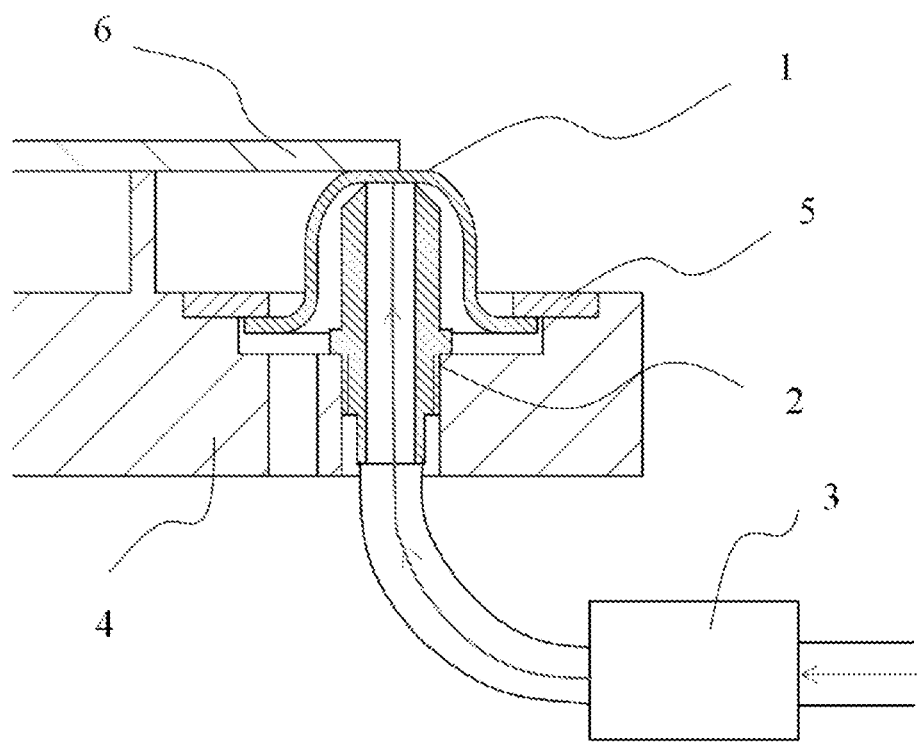
FIG. 4 is a partial sectional view of FIG. 3.
Figure 5:
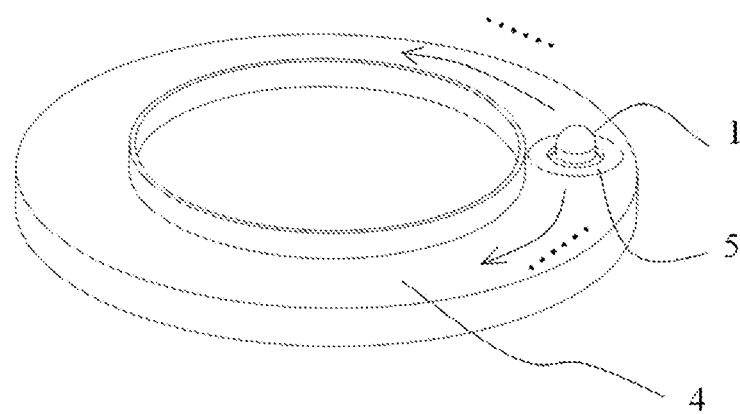
FIG. 5 is a diagram of a positional structure of a trigger component provided by an embodiment of the invention.
Figure 6:
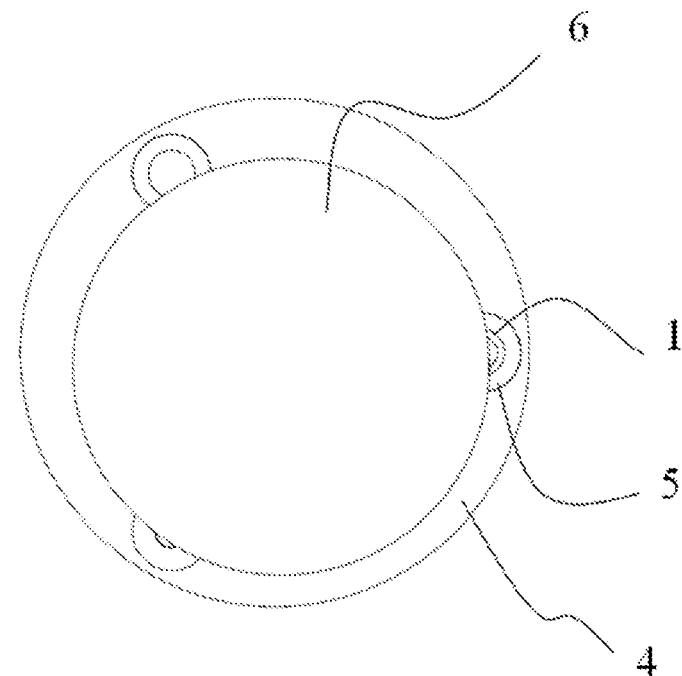
FIG. 6 is a diagram of a positional structure where a wafer and a mounting base are not aligned according to an embodiment of the invention.
Figure 7:
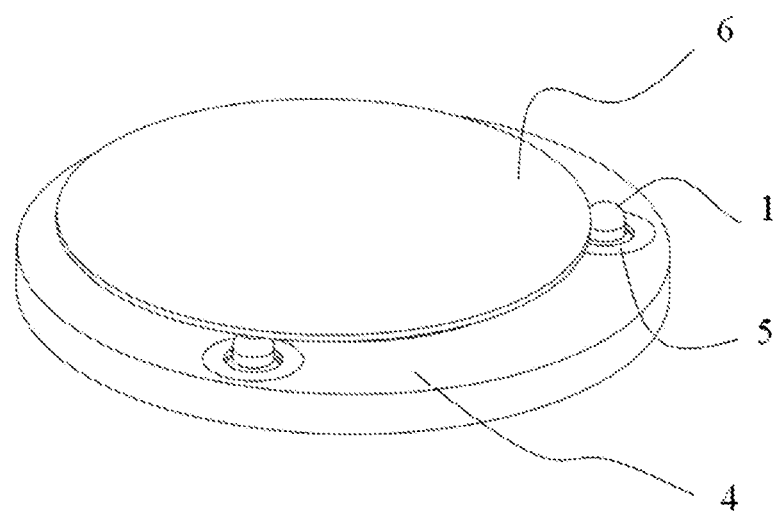
FIG. 7 is an axonometric structural diagram of FIG. 6.

Please refer to FIGS. 1-7. FIG. 1 is a diagram of an external structure of a wafer position detection device provided by an embodiment of the invention; FIG. 2 is a partial sectional view of FIG. 1; FIG. 3 is a diagram of an installation structure of a wafer and a wafer position detection device provided by an embodiment of the invention; FIG. 4 is a partial sectional view of FIG. 3; FIG. 5 is a diagram of a positional structure of a trigger component provided by an embodiment of the invention; FIG. 6 is a diagram of a positional structure where a wafer and a mounting base are not aligned according to an embodiment of the invention; and FIG. 7 is an axonometric structural diagram of FIG. 6.

In a specific implementation, the wafer position detection device in this application comprises a mounting base 4 for placing a wafer and a trigger component. The trigger component is arranged on the mounting base 4, and the mounting base 4 indirectly carries the wafer through the trigger component.

Referring to FIGS. 2 and 4, the trigger component comprises a top cover 1 and a fluid delivery pipeline. The top cover 1 protrudes from a surface of the mounting base 4 to support the wafer 6. The top cover 1 may be a column or a cone, such as a cylinder or a circular truncated cone, and the specific structure of the top cover 1 can be arranged as required. The top cover 1 is internally provided with a hollow cavity for covering the fluid delivery pipeline. The fluid delivery pipeline is arranged in a hollow cavity formed in an inner wall of the top cover 1, and the top cover 1 moves in the direction close to or away from the fluid delivery pipeline to block/open a fluid delivery port of the fluid delivery pipeline. When the wafer 6 is arranged on the top cover 1, the top cover 1 moves in the direction close to the fluid delivery pipeline to block the fluid delivery port of the fluid delivery pipeline; and when the wafer 6 is not arranged on the top cover 1, the top cover 1 moves in the direction away from the fluid delivery pipeline under fluid pressure, and the top cover 1 is out of contact with the fluid delivery port of the fluid delivery pipeline, so that the fluid delivery port of the fluid delivery pipeline is opened. The fluid delivery pipeline communicates with the hollow cavity, and the fluid in the fluid delivery pipeline flows out through the fluid delivery port, the hollow cavity and an output hole in turn, and the output hole is formed in the mounting base 4 to discharge the fluid in the hollow cavity.

For the installation mode of the top cover 1 on the mounting base, it is preferable that the mounting base 4 is provided with a mounting groove for mounting the top cover 1, a top end of the top cover 1 protrudes from the mounting groove, and a tail end of the top cover 1 is fitted into the mounting groove to prevent the top cover 1 from being separated from the mounting groove. It can be understood that the top cover 1 and the mounting groove are in clearance fit, so that the top cover 1 can move in the direction of a center line of the mounting groove to get close to or away from the fluid delivery pipeline. Further, in order to prevent the top cover 1 from rotating around its own axis under fluid pressure, resulting in relative rotary motion with the wafer 6, and thus causing abrasion or scratches on the surface of the wafer 6, it is preferable to arrange a strip-shaped guide slot in a circumferential side wall of the mounting hole to guide and restrict the linear movement of the top cover 1, and the strip-shaped guide slot is parallel to the center line of the mounting groove; and more preferably, the strip-shaped guide slot is parallel to an axis of the fluid delivery pipeline, and the top cover is provided with a guide protrusion matching the strip-shaped guide slot to ensure the linear movement of the top cover 11. In this way, the rotation freedom of the top cover 1 is limited, the top cover 1 is prevented from rotating around its own center line under the fluid pressure of the fluid delivery pipeline, and scratches caused by relative movement between the top cover 1 and the wafer are prevented, so that the yield rate is further increased and the reliability of the device is improved.

The fluid pressure detection component is connected with a control device, and detects the fluid pressure of the fluid delivery pipeline, so as to determine whether the wafer is properly positioned according to the fluid pressure of the fluid delivery pipeline. Generally, the fluid is deionized water, air or other inert gases, which can be determined as required, and fluid pressure detection components are arranged based on the type of fluid being used, all of which fall within the protection scope of the invention.

During operation, when there is no wafer on the top cover 1, the fluid in the fluid delivery pipeline enters the hollow cavity through the fluid delivery port, the top cover 1 moves away from the fluid delivery pipeline along the strip-shaped guide slot under pressure, and the maximum sliding position of the top cover 1 is limited by an end wall of the mounting hole; in this case, the pressure of the fluid delivery pipeline can be detected by the fluid pressure detection component, and whether there is a wafer on the top cover 1 at present can be determined according to the detected pressure value; when a wafer is arranged on the top cover 1, the top cover 1 moves in the direction close to the fluid delivery pipeline under the gravity of the wafer to block the fluid delivery port of the fluid delivery pipeline; and in this case, the fluid cannot enter the hollow cavity through the fluid delivery port and flow out, the fluid pressure increases, and whether the wafer is properly positioned is judged according to the detected pressure value. As mentioned above, whether the wafer is properly positioned is determined according to the pressure of the fluid delivery pipeline detected by the fluid pressure detection component. In another embodiment, when a wafer is arranged on the top cover 1, the fluid pressure value detected by the fluid pressure detection component is compared with the preset pressure value to determine whether the wafer is properly positioned. For example, when the wafer is properly positioned, the system presets the fluid pressure to be 3 Mpa, and during the alignment detection, judgment is based on the fluid pressure detected by the fluid pressure detection component, and when it is not 3 Mpa, it is considered that the current wafer is not properly positioned. A certain error range can be set as needed in the actual application process.

Further, the above-mentioned trigger component can also be used in combination with other mechanical structures or sensors to detect whether the wafer is there or properly positioned, such as a lever mechanism, a displacement sensor or a through-beam sensor, which can be set as required.

Specifically, the mounting base 4 is provided with a mounting groove for mounting the top cover 1, and a surface of the mounting groove is provided with a gland 5 for limiting the movement of the top cover 1 in the direction away from the fluid delivery pipeline. The gland 5 and the mounting groove are detachably and fixedly connected, such as by threaded fasteners. A bottom edge of the top cover 1 matching the mounting groove is provided with an outer edge part, the outer edge part matches the gland 5 to limit the top cover 1, and the outer edge part is continuously arranged around a bottom edge of the top cover 1. The gland 5 is preferably arranged continuously around a circumferential edge of the mounting groove, or it can be arranged intermittently, both of which are within the protection scope of the invention.

The fluid delivery pipeline comprises a nozzle 2 and an input pipeline. The nozzle 2 is detachably and fixedly connected to the mounting base 4. In one embodiment, the mounting base 4 is provided with a mounting through hole for mounting the nozzle 2, the mounting through hole penetrates through the mounting base 4 in the thickness direction of the mounting base and is provided with an internal thread, and the nozzle 2 is provided with an external thread matching the internal thread, so that the nozzle 2 and the mounting base 4 can be fixed through threaded connection; one end of the input pipeline is connected with the nozzle 2, and the other end is connected with a fluid power source; and the fluid pressure detection component is preferably arranged on the fluid delivery pipeline, the flow rate of the fluid is stable, the interference on the fluid pressure detection is reduced, and the fluid pressure detection accuracy is improved.

In one embodiment, in order to prevent fluid spillage from damaging the wafer and affecting the yield rate, the output hole is arranged towards the other side of the mounting base 4, the output hole is formed in a bottom wall of the mounting groove and penetrates through the mounting base 4 in the direction away from the top cover 1, and an axis of the output hole is preferably set parallel to an axis of the fluid delivery pipeline, so as to optimize the installation space and facilitate the connection between the output hole and an output pipeline.

Preferably, the fluid pressure detection component is a water pressure sensor 3, and the fluid is deionized water. The water pressure sensor 3 is simple in structure and easy to set, and the cleanliness of deionized water is high, thus reducing the interference on the wafer surface.

Specifically, the control device comprises:

a fluid pressure determining unit used for determining whether a fluid pressure value detected by the fluid pressure detection component is equal to a first preset pressure value, and if so, sending a prompting message indicating that the wafer 6 is properly positioned currently; determining whether the fluid pressure value detected by the fluid pressure detection component is equal to a second preset pressure value, and if so, sending a prompting message indicating that there is no wafer at a current station, the first preset pressure value being greater than the second preset pressure value; and determining whether the fluid pressure value detected by the fluid pressure detection component is greater than the second preset pressure value and less than the first preset pressure value, and if so, sending a prompting message indicating that the wafer 6 is not properly positioned currently. In this way, whether the wafer is properly positioned is determined.

Referring to FIGS. 6 and 7, it can be understood that when the wafer position detection device comprises a plurality of trigger components and the fluid pressure values detected by all the fluid pressure detection components are equal to the first preset pressure value, it is considered that there is no wafer on the mounting base 4, and the wafer release operation can be performed; when the fluid pressure values detected by all the fluid pressure detection components are equal to the second preset pressure values, it is considered that there is a wafer on the mounting base 4 and the wafer is properly positioned, and the wafer removal operation can be performed; when the fluid pressure value detected by any fluid pressure detection component is between the first preset pressure value and the second preset pressure value, it is considered that there is a wafer on the mounting base 4 but the wafer is not properly positioned, and an alarm is given; in the first two cases, the fluid pressure value detected by the fluid pressure detection component of each trigger component should be equal to the first preset pressure value/the second preset pressure value, so as to further improve the detection accuracy, and the bearing condition of the mounting base 4 can be monitored before the wafer removal/releasing operation, thus improving the safety of the device.

On the basis of the above-mentioned embodiments, in order to reduce the contact area between the top cover 1 and the wafer and prevent scratches, the top cover 1 has a cambered surface so as to prevent scratches when the wafer and the top cover 1 move relative to each other, and further improve the yield rate. Further, the top cover 1 can also be set as an arc-shaped top cover 1 or other forms of end covers, as long as the same technical effects can be achieved. It can be understood that when the top cover is a cambered/arc-shaped top cover, the nozzle can be set as a cambered/arc-shaped nozzle accordingly to conform to the inner wall of the top cover, thus improving the blocking effect and reducing the error of fluid pressure detection.

Specifically, the wafer position detection device comprises a plurality of trigger components, which are uniformly arranged on the mounting base 4. In uniform arrangement, such as matrix arrangement in a horizontal or vertical direction, the nozzles 2 of the trigger components are respectively connected with the fluid pressure detection components to supply water independently.

Based on the pressure detected by the fluid pressure detection components connected to the trigger components at different locations, the position and orientation of the wafer can be judged and adjusted. This provides guidance for the control device to control a driving component, enabling corresponding position adjustments of the wafer and simplifying the alignment operation. In another embodiment, the nozzles 2 of the trigger components can also be connected to a single main pipeline for water supply, each main pipeline is connected to the same fluid pressure detection component, and such a setting simplifies the connection between devices and pipelines and reduces costs. It is understood that the number of trigger components should be determined according to the size of the mounting base 4 and the weight of the wafer 6.

Preferably, the wafer position detection device comprises three trigger components which are symmetrical with respect to a center of the mounting base 4, and the fluid delivery pipelines of the three trigger components are each connected with one fluid pressure detection component. The three trigger components have the same structure, so as to facilitate production and processing. The mounting base 4 is preferably a circular mounting base 4, and all the trigger components are symmetrical with respect to a center of the circular mounting base 4, further optimizing the structure of the mounting base 4.

Compared with the prior art, the wafer position detection device provided by the invention has the following technical effects:

first, the fluid pressure detection component makes indirect contact with the wafer through the top cover to indirectly detect the position of the wafer; compared with lever braking type sensors, the fluid pressure detection component does not need to make direct contact with the wafer, preventing surface defects that will affect yield rates caused by direct contact; and compared with optical sensors, the wafer position detection device realizes position detection of light-sensitive wafers, broadening the application range and improving device versatility;

second, whether the wafer is properly positioned is judged by comparing the pressure value detected by the fluid pressure detection component and the preset pressure value, and guidance is provided for subsequent wafer position adjustment according to the pressure values detected by the fluid pressure detection component at different positions;

third, the top of the top cover is a cambered surface, which is in point contact with a wafer plane, thus reducing the contact area between the two and preventing accumulation of impurities between the top cover and the wafer; and when impurities exist between the top cover and the wafer, as the scratch area caused by relative sliding is reduced, the yield rate is improved; and fourth, the strip-shaped guide slot is formed in the mounting groove, so that the top cover can only move in a linear direction, and the rotation freedom that may occur under the action of fluid is limited to prevent scratches from being generated between the top cover and the wafer due to the rotation of the top cover, thus maintaining relative stability between the top cover and the wafer and further improving the reliability of the device.

Finally, it should be noted that relational terms such as "first" and "second" herein are only used to distinguish one entity or operation from another entity or operation, and do not necessarily require or imply that there is any such actual relationship or order between these entities or operations. Moreover, the term "comprise", "include" or any other variations thereof are intended to encompass non-exclusively, such that a process, method, article, or apparatus that comprises a series of elements not only comprises those elements but may also comprise other elements not explicitly listed or inherently present in such process, method, article, or apparatus. In the absence of further limitations, elements defined by the phrase "comprising a . . . " are not excluded from having additional identical elements in the process, method, article, or apparatus that comprises the described elements.

What is claimed is:

1. A wafer position detection device, comprising:
    a mounting base;
    a trigger component arranged on the mounting base, wherein the trigger component comprises a top cover protruding from a surface of the mounting base to support a wafer, and a fluid delivery pipeline arranged in a hollow cavity formed in an inner wall of the top cover; when a wafer is arranged on the top cover, the top cover moves in a direction close to the fluid delivery pipeline to block a fluid delivery port of the fluid delivery pipeline; and when no wafer is arranged on the top cover, the top cover moves in a direction away from the fluid delivery pipeline under fluid pressure to open the fluid delivery port of the fluid delivery pipeline; and
    a fluid pressure detection component connected with a control device and used for detecting the fluid pressure of the fluid delivery pipeline,
    wherein the mounting base is provided with a mounting groove for mounting the top cover, and a surface of the mounting groove is provided with a gland for limiting the movement of the top cover in the direction away from the fluid delivery pipeline,
    wherein a circumferential side wall of the mounting groove is provided with a strip-shaped guide slot for linearly guiding the movement of the top cover, and the strip-shaped guide slot is parallel to a center line of the mounting groove; and the top cover is provided with a guide protrusion matching the strip-shaped guide slot.

2. The wafer position detection device according to claim 1, further comprising an output hole formed in the mounting base and used for discharging fluid in the hollow cavity, and the output hole is formed in a bottom wall of the mounting groove and penetrates through the mounting base in a direction away from the top cover.

3. The wafer position detection device according to claim 1, wherein the fluid delivery pipeline comprises:
    a nozzle detachably and fixedly connected to the mounting base; and
    an input pipeline with one end connected with the nozzle and the other end connected with a fluid power source.

4. The wafer position detection device according to claim 3, wherein the mounting base is provided with a mounting through hole for mounting the nozzle, the mounting through hole penetrates through the mounting base in a thickness direction of the mounting base and is provided with an internal thread, and the nozzle is provided with an external thread matching the internal thread.

5. The wafer position detection device according to claim 1, wherein the control device comprises:
    a fluid pressure determining unit used for determining whether a fluid pressure value detected by the fluid pressure detection component is equal to a first preset pressure value, and if so, sending a prompting message indicating that the wafer is properly positioned currently; determining whether the fluid pressure value detected by the fluid pressure detection component is equal to a second preset pressure value, and if so, sending a prompting message indicating that there is no wafer at a current station, the first preset pressure value being greater than the second preset pressure value; and determining whether the fluid pressure value detected by the fluid pressure detection component is greater than the second preset pressure value and less than the first preset pressure value, and if so, sending a prompting message indicating that the wafer is not properly positioned currently.

6. The wafer position detection device according to claim 1, wherein the top cover is a cambered top cover.

7. The wafer position detection device according to claim 6, wherein the wafer position detection device comprises a plurality of said trigger components, which are uniformly arranged on the mounting base.

8. The wafer position detection device according to claim 7, wherein the wafer position detection device comprises three said trigger components which are symmetrical with respect to a center of the mounting base, and the fluid delivery pipelines of the three trigger components are each connected with one fluid pressure detection component.

* * * * *